United States Patent [19]

Okayasu

[11] Patent Number: 4,881,593

[45] Date of Patent: Nov. 21, 1989

[54] HEAT CONDUCTING DEVICE

[76] Inventor: Kenji Okayasu, 20-15, Mukai-machi, Gyoda-shi, Saitama-ken, 361, Japan

[21] Appl. No.: 288,611

[22] Filed: Dec. 22, 1988

[30] Foreign Application Priority Data

Dec. 22, 1987 [JP] Japan .................. 62-324819

[51] Int. Cl.$^4$ ........................................... F28D 15/00
[52] U.S. Cl. .................. 165/104.29; 165/10; 165/104.31; 165/104.14; 417/209
[58] Field of Search .............. 165/10, 104.31, 104.29, 165/104.22; 417/208, 209

[56]     References Cited
        U.S. PATENT DOCUMENTS

| 3,929,305 | 11/1975 | Sabol | 165/104.29 |
| 4,120,172 | 10/1978 | Pierce | 165/104.29 |
| 4,212,593 | 7/1980 | Chadwick | 417/209 |
| 4,450,690 | 5/1984 | Clark, Jr. | 165/104.22 |
| 4,590,993 | 5/1986 | Kurzweg | 165/104.31 |
| 4,625,790 | 12/1986 | Okayasu | 165/104.29 |
| 4,792,283 | 12/1988 | Okayasu | 417/209 |

FOREIGN PATENT DOCUMENTS 31679  2/1986  Japan .
122170 8/1987  Japan .
122171 8/1987  Japan .
897785 5/1962  United Kingdom .

OTHER PUBLICATIONS

Technology Review, Diagram: Omnigraphics, 88-6 (Aug./Sep. 1985), p. 64.
Japan Mechanic Association Magazine, vol. 90, No. 824, p. 79.

Primary Examiner—Albert W. Davis, Jr.
Attorney, Agent, or Firm—Cushman, Darby & Cushman

[57]          ABSTRACT

A heat conducting device having dream pipes for spatially transporting heat without circulation of liquid by repeating heat accumulation and radiation in a boundary layers formed on wall surfaces of flow passages by forward and rearward movement of liquid with vibration applied thereto comprising a flow passage or a chamber including a heat drive pump arranged to be operated by growth and contraction of steam bubbles in which each end of the dream pipes is opened, wherein a power for forward and rearward moving the liquid in the dream pipes depends upon the heat drive pump and another end of each of the dream pipes is designed to be telescopic.

2 Claims, 2 Drawing Sheets

HEAT CONDUCTING DEVICE

BACKGROUND OF THE INVENTION

1. Field of the Invention

The present invention relates to a heat conducting device which can conveiently be used for cooling or heating the portions in which a heat pipe cannot be utilized sufficiently, such as small portions of electronic circuits or precision mechanical equipments or soft articles such as hot carpets or warm cloths.

2. Description of the Prior Art

In order to achieve the above-described object, "Dream Pipe" has been invented by Ulrich, Kurzweg, as disclosed at U.S. Pat. No. 4,590,993 granted May 27, 1986, at P. 64, 88-6 (Aug/Sept.), 1985, "Technology Review, Diagram: Omnigraphics" and also at P. 79, No. 824, Vol 90, Japan Mechanic Association Magazine.

The above-described "Dream Pipe" is characterized by that heat can be kinetically conducted through a pipe by using a boundary layer formed on the wall of a pipe by forward or rearward moving the liquid in the pipe with vibration applied to the pipe. The pipes of the type described above can exhibit advantages, with respect to heat pipes, that the operating temperature can be selected optionally, only a low pressure needs to operate such pipes, the operation start and stop can be freely conducted, both wick device and the vacuum operation are not necessary, the structure is simple, and thereby such pipes can be easily manufactured.

However, the "Dream Pipe" cannot be operated only by a temperature difference, the temperature difference though being sufficient to operate the heat pipes. Therefore, an outside power for applying vibration to the liquid such as an electric motor or a compressor needs to be provided.

SUMMARY OF THE INVENTION

An object of the present invention is to provide a heat conducting device in which the characteristics of the "Dream Pipe" cannot be deteriorated, and capable of being individually operated by only a temperature difference, similarly to the heat pipes.

A heat conducting device having dream pipes according to the present invention for spatially transporting heat without circulation of liquid by repeating heat accumulation and radiation in boundary layers formed on wall surfaces of flow passages by forward and rearward movement of liquid with vibration applied thereto comprising a flow passage or a chamber including a heat drive pump arranged to be operated by growth and contraction of steam bubbles in which each end of the dream pipes is opened, wherein a power for forward and rearward moving the liquid in the dream pipes depends upon the heat drive pump and another end of each of the dream pipes is designed to be telescopic.

A heat conducting device according to another embodiment of the present invention is characterized in that each end of the dream pipes is opened to another flow passage or chamber which is connected, via a pressure conducting device, to the above-described flow passage or chamber including the heat drive pump.

DESCRIPTION OF THE PREFERRED EMBODIMENTS

Figure 1:
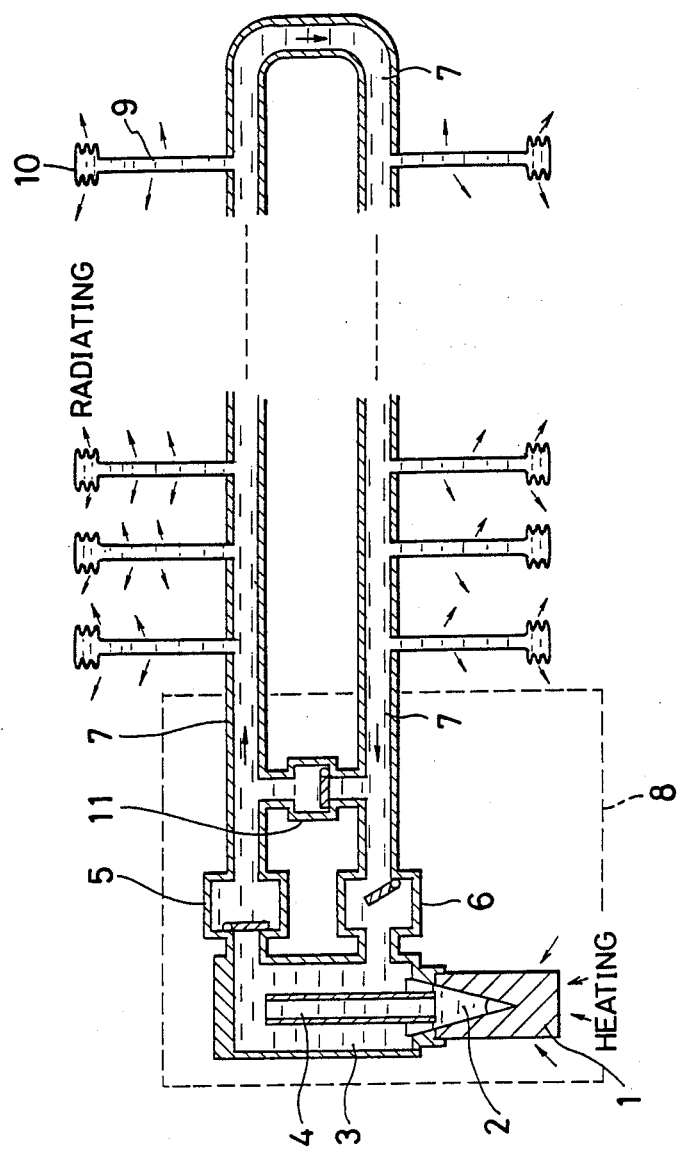
FIG. 1 is a schematic cross-sectional view of a heat conducting device according to the present invention.

FIG. 1 illustrates an embodiment of the present invention, wherein a heat conducting device is used as a heating device. The portion surrounded by a dashed line serves as a heat drive pump 8, this heat drive pump 8 being provided with a heating portion 1 which includes a cavity portion 2 so that heat delivered by a heat source in the heating potion 1 is absorbed and thereby steam bubbles are generated in the cavity portion 2 disposed inside the heating portion 1. The thus-generated bubbles grow and reach a condensing pipe 4 disposed in a gas-liquid converter chamber 3, wherein the bubbles are immediately cooled down, condensed, and disappears. At this time, since a discharge stop valve 5 and a suction stop valve 6 are each connected to the gas-liquid converting chamber 3, the heated liquid is discharged to an outer pipe 7, while the cooled liquid is introduced from the outer pipe 7, via the suction stop valve 6, into the gas-liquid converting chamber 3.

Thus, the heat drive pump 8 circulates the liquid through the outer pipe 7, and as well supplies heat, absorbed by the heating portion 1 thereof, to the outer pipe 7. A multiplicity of dream pipes 9 having an opened end thereof are secured to the thus-formed outer pipe 7, the dream pipes 9 each having a small-sized diaphragm type accumulator 10. By virtue of the pressure change caused from growth and disappearance of the air bubbles in the heat drive pump 8, the liquid in the dream pipes 9 is forward and rearward moved with vibration applied thereto. As a result of such forward and rearward movement, boundary layers generated on the pipe walls in the dream pipes 9 gradually conduct the heat in the outer pipe 7 toward the diaphragm type accumulators 10 disposed at the front ends of the dream pipes 9 with heat supplied and received between the boundary layers and the liquid which is being forward and rearward moved. Through these pipe walls, heat can be delivered outside. An water hammer prevention stopper valve 11 is provided for the purpose of avoiding pressure rise due to inertia of the liquid in the outer pipe 7 generated when the stopper valve of the heat drive pump 8 is operated. Although there is a variety of types of the heat drive pump, any one can be available only satisfying the required factor of pressure change. Alternatively, a structure may be employed in that a partial portion of the outer pipe is expanded so as to be a chamber to which each end of the dream pipes is opened. Furthermore, the diaphragm type accumulators 10 may be in the form of a bag made of rubber or soft plastic. The outer pipes 7 and the dream pipes 9 may be made of flexible vinyl pipes or the like.

Referring to FIG. 1, arrows disposed below the heating portion 1 designate the directions of the heat. Similarly, arrows disposed around the dream pipes 9 and the accumulators 10 also designate the directions of heat which has been radiated toward the outside thermal load.

Figure 2:
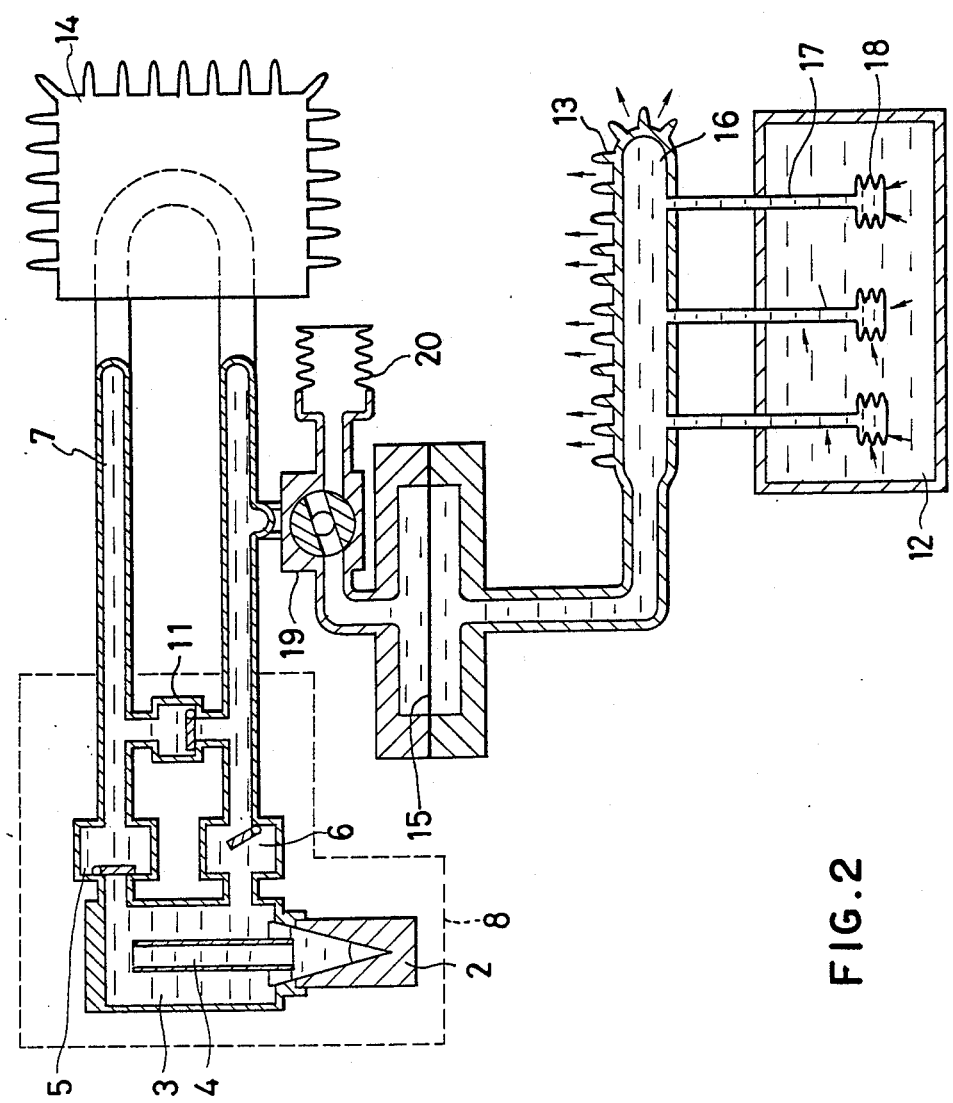
FIG. 2 is a schematic cross-sectional view of a heat conducting device according to another embodiment of the present invention.

FIG. 2 illustrates another embodiment of the present invention in which the device according to the present invention is used as a cooling device that is characterized in that heat is removed from a thermal load 12 and the thus-removed heat is arranged to be radiated outside 12 by using a load radiating fin 13. Similarly to the former embodiment, the portion surrounded by a dashed line serves as a heat drive pump 8 which has a heat source provided individually from the thermal load. Since the outer pipe 7 passes through a pump radiating device 14, heat from the heat drive pump 8 is conducted to this pump radiating device 14 by the liquid circulation. Therefore, only the pressure change in the heat drive pump 8 is conducted to a dream pipe radiating chamber 15 via a diaphragm type pressure conducting device 15 connected to the outer pipe 7 at the lower stream to the radiating device 14. Therefore, the dream pipes 17 connected to the dream pipe radiating chamber 16 and diaphragm type accumulators 18 thereof are operated. The dream pipes 17 and the diaphragm type accumulator thereof are disposed in the thermal load 12 so that heat in this thermal load 12 is conducted to the heat radiating chamber 16 from which the heat is delivered by the radiating fin 13. A flow-rate distribution valve 19 is disposed between the outer pipe 7 and the diaphragm type pressure conducting device 15 and is connected between them and is as well connected to a sub-accumulator 20. By operating this flow-rate distribution valve 19, flow rate upon the pressure change in the heat drive pump can be as needs distributed between the diaphragm type pressure conducting device 15 and the sub-accumulator 20. Consequently, the operating force by the dream pipes can be controlled for the purpose of controlling the amount of heat conducted through the dream pipes.

What is claimed is:

1. A heat conducting device having dream pipes for spatially transporting heat without circulation of liquid by repeating heat accumulation and radiation in a boundary layers formed on wall surfaces of flow passages by forward and rearward movement of liquid with vibration applied thereto, said conducting device comprising:

a flow passage or a chamber including a heat drive pump arranged to be operated by growth and contraction of steam bubbles in which each end of said dream pipes is opened, wherein a power for forward and rearward moving said liquid in said dream pipes depends upon said heat drive pump and another end of each of said dream pipes is designed to be telescopic.

2. A heat conducting device having dream pipes for spatially transporting heat without circulation of liquid by repeating heat accumulation and radiation in a boundary layers formed on wall surfaces of flow passages by forward and rearward movement of liquid with vibration applied thereto, said conducting device comprising:

a flow passage or a chamber connected, via a pressure conducting device, to another flow passage or chamber including a heat drive pump arranged to be operated by growth and contraction of steam bubbles in which each end of said dream pipes is opened, wherein a power for forward and rearward moving said liquid in said dream pipes depends upon said heat drive pump and another end of each of said dream pipes is designed to be telescopic.

* * * * *